(12) United States Patent
Tremblay et al.

(10) Patent No.: US 8,628,342 B2
(45) Date of Patent: Jan. 14, 2014

(54) SWIVEL ADAPTOR (75) Inventors: Eric Tremblay, Quebec (CA); Tommy Dallaire, Quebec (CA)

(73) Assignee: RV Lighting, Quebec (CA)

( * ) Notice: Subject to any disclaimer, the term of this patent is extended or adjusted under 35 U.S.C. 154(b) by 38 days.

(21) Appl. No.: 13/487,436

(22) Filed: Jun. 4, 2012

(65) Prior Publication Data
US 2013/0323938 A1  Dec. 5, 2013

(51) Int. Cl.
*H01R 33/02* (2006.01)

(52) U.S. Cl.
USPC ............................. 439/236; 362/649; 362/646

(58) Field of Classification Search
USPC .............. 439/220, 226, 236, 238, 240, 699.2;
362/249.02, 646, 647, 651, 655, 656
See application file for complete search history.

(56) References Cited

U.S. PATENT DOCUMENTS

| | | | | |
|---|---|---|---|---|
| 3,739,313 A * | 6/1973 | Gaia et al. | ...................... | 337/206 |
| 6,488,510 B2 * | 12/2002 | Li | ................................. | 439/13 |
| 7,052,171 B1 * | 5/2006 | Lefebvre et al. | .............. | 362/649 |
| 7,481,570 B2 * | 1/2009 | Souza et al. | ................... | 362/642 |
| 8,021,192 B2 * | 9/2011 | Takata | .......................... | 439/628 |
| 8,066,411 B1 * | 11/2011 | Barton et al. | .................. | 362/310 |
| 8,157,408 B2 * | 4/2012 | Yang et al. | ............... | 362/217.13 |
| 8,454,193 B2 * | 6/2013 | Simon et al. | ............. | 362/217.17 |
| 2009/0068869 A1 * | 3/2009 | Brand et al. | ................... | 439/226 |
| 2012/0224375 A1 * | 9/2012 | Zaderej et al. | ........... | 362/249.02 |

* cited by examiner

*Primary Examiner* — Briggitte R Hammond
(74) *Attorney, Agent, or Firm* — Potomac Patent Group PLLC (57) ABSTRACT

A device comprising a bottom portion providing a first contact and a second contact via an outer surface, an inner surface is conductive with the outer surface. The device comprises a bottom pressure pin, within the bottom portion, connected to the first contact and a top portion rotatably fixed to the bottom portion and comprising first and second connectors functionally exposed therethrough. The device comprises a printed circuit board (PCB), within the bottom portion, providing a first route to the first connector and a second route to the second connector. The PCB is fixably attached to the electrical connectors and the first route continuously contacts with the bottom pressure pin. The device comprises a radial pressure pin, fixably connected to the second route, that provides continuous connection with the second contact through the bottom portion's inner surface. A method of assembly of the device and a kit comprising the device.

15 Claims, 8 Drawing Sheets

SWIVEL ADAPTOR

TECHNICAL FIELD

The present invention relates to lighting systems and, more particularly, to LED-based bulb kit.

BACKGROUND

Lighting systems have evolved over the years with different technological advents. One of the latest evolutions is based on Light Emitting Diode (LED) technology. High power LEDs present a good ratio of lumens per power unit and provide an alternate solution to conventional incandescent technology, which tend to have a shorter lifespan (e.g., 10 to 50 times shorter than properly driven high power LEDs).

Providing a replacement technology for a product as widely used as incandescent light bulbs presents many challenges. Because of the market maturity, a viable solution needs to be compatible with already adopted form factors. Yet, the constraints of LED-based products trigger different requirements.

The present invention addresses the compatibility between LED-based products and different form factors used with conventional technology.

SUMMARY

A first aspect of the present invention is directed to a device comprising a bottom portion and a top portion rotatably fixed to the bottom portion. The bottom portion provides at least a first external electrical contact point below the bottom portion and a second external electrical contact point through an outer surface of the bottom portion. A bottom pressure pin is positioned within the bottom portion and electrically connected to the first contact point (e.g., soldered). An inner surface of the bottom portion is electrically conductive with the outer surface (i.e., second contact point). The top portion comprises a first electrical connector and a second electrical connector, both connectors being functionally exposed therethrough. A printed circuit board (PCB) is positioned within the bottom portion. The PCB provides a first connection route in electrical connection with the first electrical connector and a second connection route in electrical connection with the second electrical connector. The PCB is soldered to the first and second electrical connectors thereby fixably attaching the top portion and the PCB. The first connection route is in continuous electrical contact with the bottom pressure pin. A radial pressure pin is fixably connected (e.g., soldered) to the PCB's second connection route. The radial pressure pin provides continuous electrical connection with the second contact point through the bottom portion's inner surface.

The continuous electrical connection between the PCB's first connection route and the bottom pressure pin, and the continuous electrical connection between the bottom portion's inner surface and the radial pressure pin, are maintained while the top portion is rotated over the bottom portion.

The radial pressure pin may be a spring loaded connector that can vary in length to maintain the continuous electrical connection with the inner surface. Likewise, the bottom pressure pin may be a spring loaded connector that can vary in length to maintain the continuous electrical connection with the PCB's first connection route. Optionally, the spring loaded connector used may have been designed for electronic programming equipment or test equipment. The bottom pressure pin may contact with the PCB's first connection route at a central connection point of the PCB.

The first and second connectors may be compatible with a wedge connector and a G4 connector through the top portion. The bottom portion's outer surface may be shaped as a bayonet lamp cap or a screw lamp cap.

A second aspect of the present invention is directed to a kit of parts for providing a replacement light bulb. The kit comprises a swivel adaptor, in accordance with the first aspect of the present invention as described above, and a Light Emitting Diode (LED)-array printed circuit board (PCB) compatible with the first and second connectors of the swivel adaptor. The LED-array PCB may provide a wedge or G4 connector. The LED-array PCB may also be flat.

A third aspect of the present invention is directed to a method for assembling a swivel adaptor. The method comprises soldering a bottom pressure pin to form an external bottom contact point of a lamp cap, wherein the bottom pressure pin is positioned within the lamp cap. the method also comprises soldering a radial pressure pin on a radial contact point of a printed circuit board (PCB), wherein the PCB has a central contact point. A first connector is soldered to the PCB in electrical connection to the central contact point and a second connector is soldered to the PCB in electrical connection to the radial contact point. The method also comprises fixably inserting the first and second connectors within a swivel top thereby allowing the connectors to be functionally exposed through the swivel top. The method further comprises inserting the PCB, attached to the swivel top, within the lamp cap whereby the bottom pressure pin contacts the central contact point of the PCB and the radial pressure pin contacts the inner surface of the lamp cap. The swivel top rotatably snaps on the lamp cap.

Optionally, the radial pressure pin may be a spring loaded connector that can vary in length to maintain a continuous electrical connection with the inner surface during rotation of the swivel top over the lamp cap. Likewise, the bottom pressure pin may also optionally be a spring loaded connector that can vary in length to maintain a continuous electrical connection with the PCB's central contact point during rotation of the swivel top over the lamp cap.

BRIEF DESCRIPTION OF THE DRAWINGS

Further features and exemplary advantages of the present invention will become apparent from the following detailed description, taken in conjunction with the appended drawings, in which.

DETAILED DESCRIPTION

Reference is now made to the drawings, in which FIGS. 1A, 1B, 1C and 1D, herein referred to concurrently as FIG. 1, show a perspective view of an exemplary light bulb casing 100 in accordance with the teachings of the present invention. The light bulb casing 100 is shown with a bayonet light bulb socket 110A for receiving a bayonet conventional light bulb (not shown). The bayonet light bulb socket 110A has its L-shaped slots 120A substantially aligned with the vertical axis of the light bulb casing 100. FIG. 1 also shows other bayonet light bulb socket 110B and 110C having their respective L-shaped slots 120B ad 120C aligned differently with reference to the light bulb casing 100.

The light bulb casing 100 could also comprise a wedge bulb socket 130 capable of receiving G4 light bulb (not shown) or a wedge shape circuit (not shown). The wedge shaped circuit is a flat shape that receives an array of high power LEDs on its face and electronic components to drive the LEDs on its back. The wedge shape circuit is meant to advantageously replace a conventional light bulb in the light bulb casing 100.

The wedge bulb socket 130 and the bayonet light bulb socket 110A-C are two common form factors. A provider of replacement LED bulb or Original Equipment Manufacturer (OEM) LED bulb has a market advantage if its product or kit is able to fit into these two common form factors. Minimising the number of LED circuits in a product line of LED bulbs is also advantageous. As can be appreciated from FIG. 1, however, there are different angles to the slots 110A-C, making production of a single product or kit addressing the two common form factors difficult.

Figure 1A:
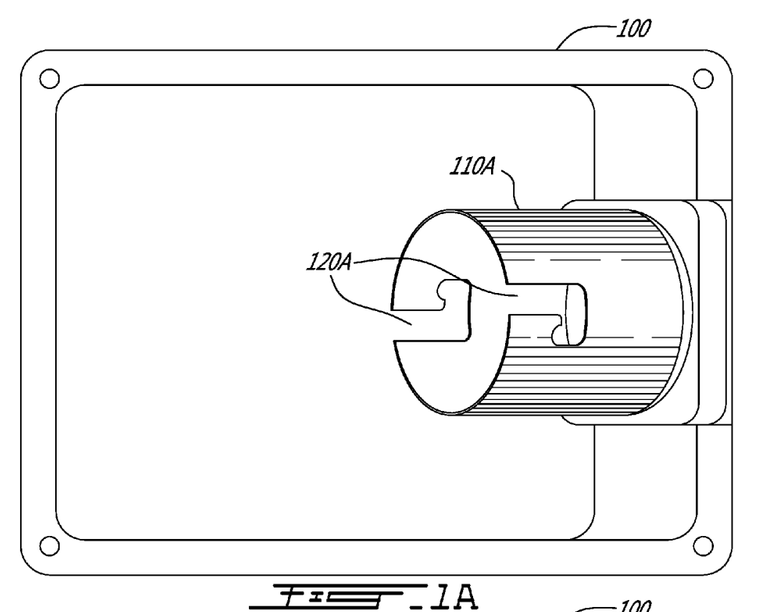
FIG. 1A, FIG. 1B, FIG. 1C and FIG. 1D herein referred to concurrently as FIG. 1 are perspective views of an exemplary light bulb casing in accordance with the teachings of the present invention.
Figure 1B:
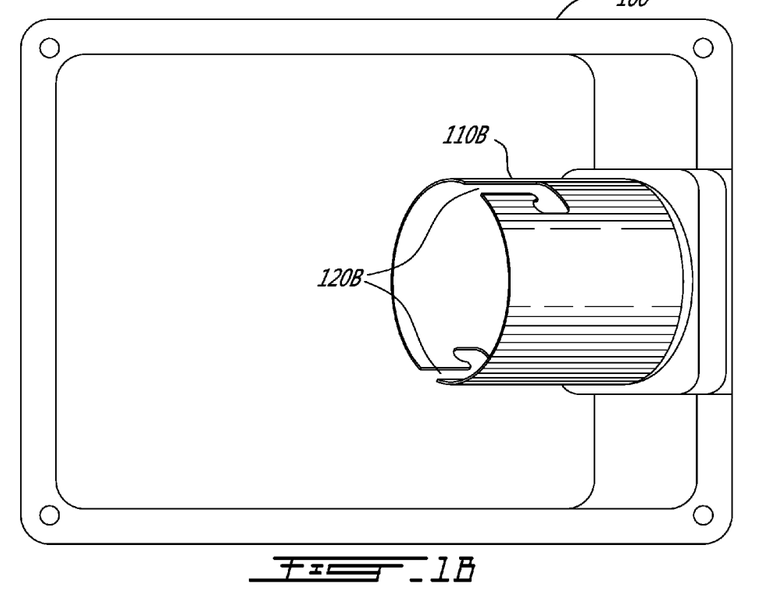
Figure 1C:
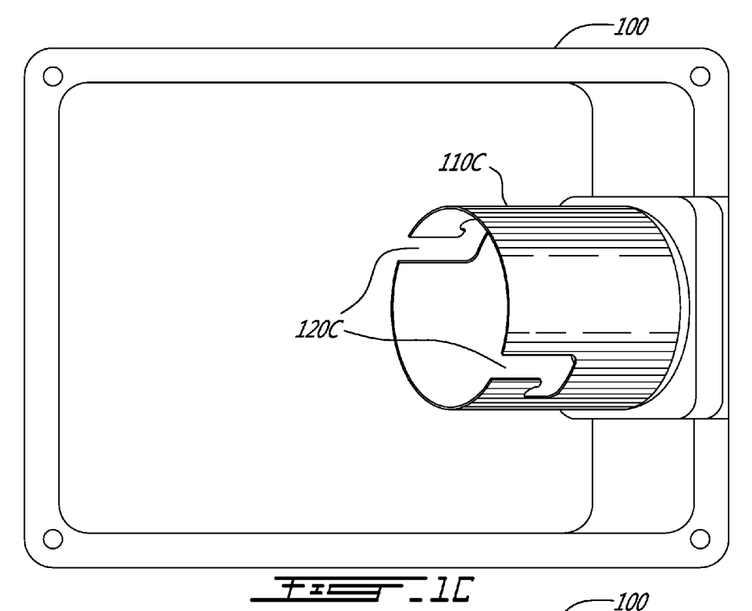
Figure 1D:
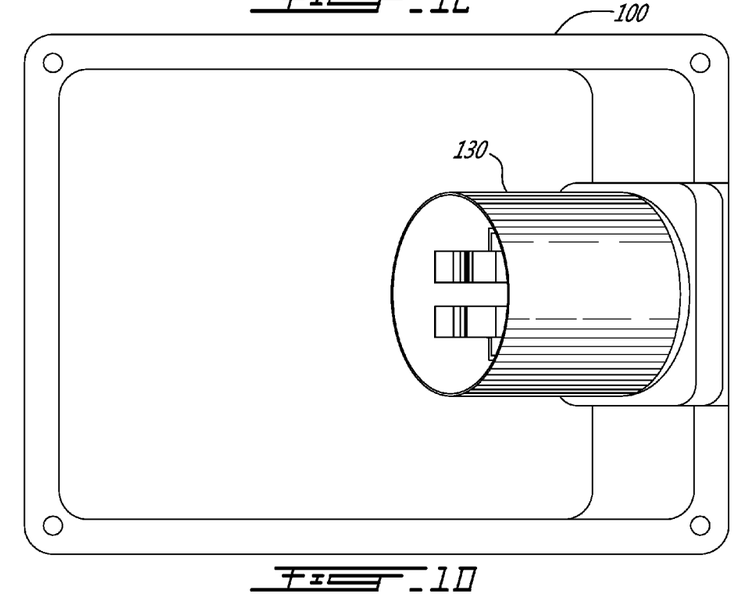
Figure 2:
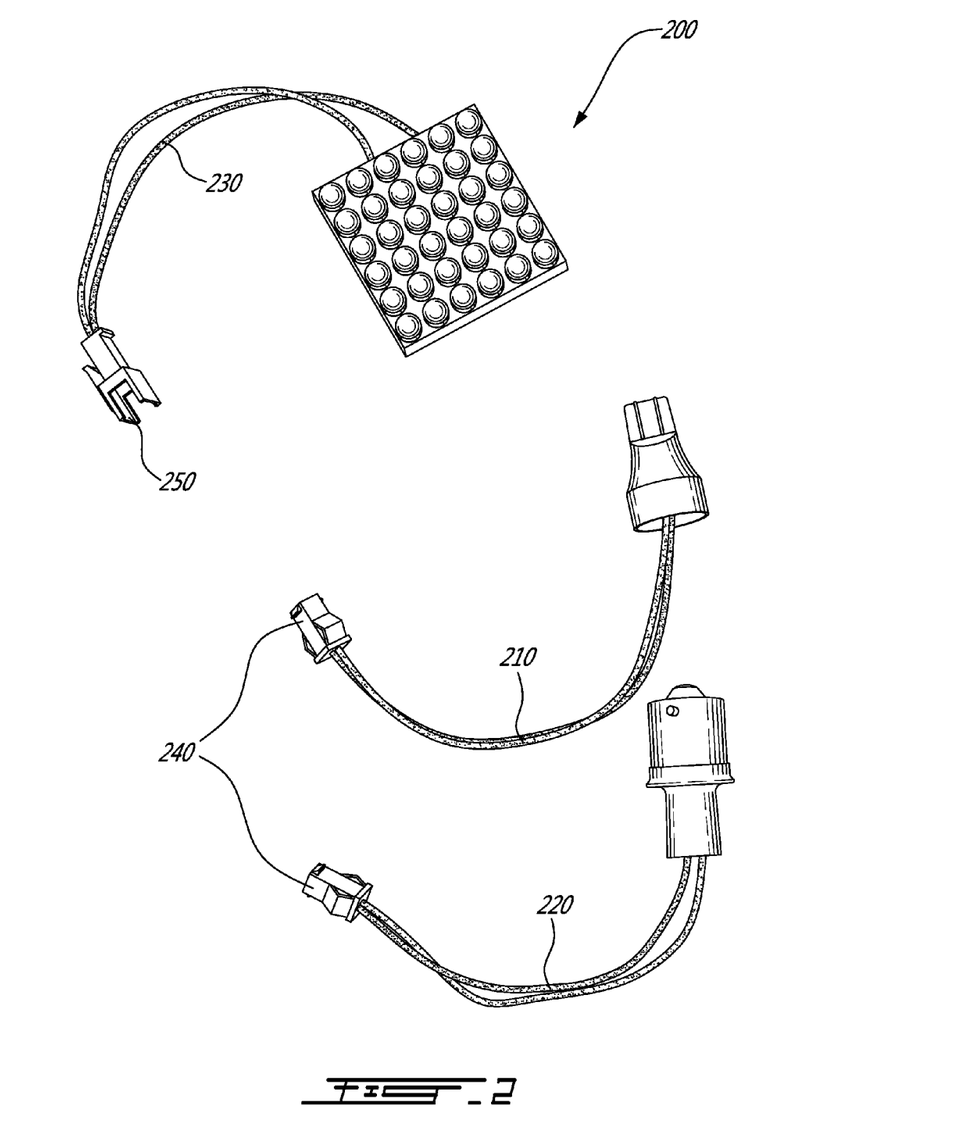
FIG. 2 is a view of an exemplary kit of parts in accordance with the teachings of the present invention.

FIG. 2 shows a kit 200 of parts that can be sold to address the need for a unique product compatible with the different exemplified form factors of the light bulb casing 100. It contains a wedge-compatible connector 210, a bayonet-compatible connector 220 and a LED-array 230. The connectors 210 and 220 are meant to be connected in one of the sockets 110A-C or 130 in the light bulb casing 100. A two-wire connector 240 of the wedge-compatible connector 210 or the bayonet-compatible 220, in turn, connects to a mating two-wire connector 250 of the LED-array 230. The LED-array 230 is meant to be fastened (e.g., glued with double face tape) within the light bulb casing 100.

There are a number of issues with the kit 200, some of which are listed hereinafter. For instance, the LED-array 230 is difficult to fasten within the light bulb casing 100. The light bulb casing 100 usually presents a concave back surface, which makes proper adherence of the LED-array 100 more difficult. It is also difficult to properly fasten the LED-array 230 within the light bulb casing 100 for a period of time that matches the expected long lifespan of the LED-array 230. Trying to re-fasten or replace the LED-array 230 is also made difficult by the residues from previous fastening attempts. Alignment of the LED-array 230 is also limited by the back surface of the light bulb casing 100, which has not been designed for this purpose. Another disadvantage of the kit 200 is the required wires, which are difficult to maintain within the light bulb casing 100 without interfering with light emitted by the LED-array 230. Heat dissipated by the LED-array 230 may also cause problems to the wires.

Figure 3:
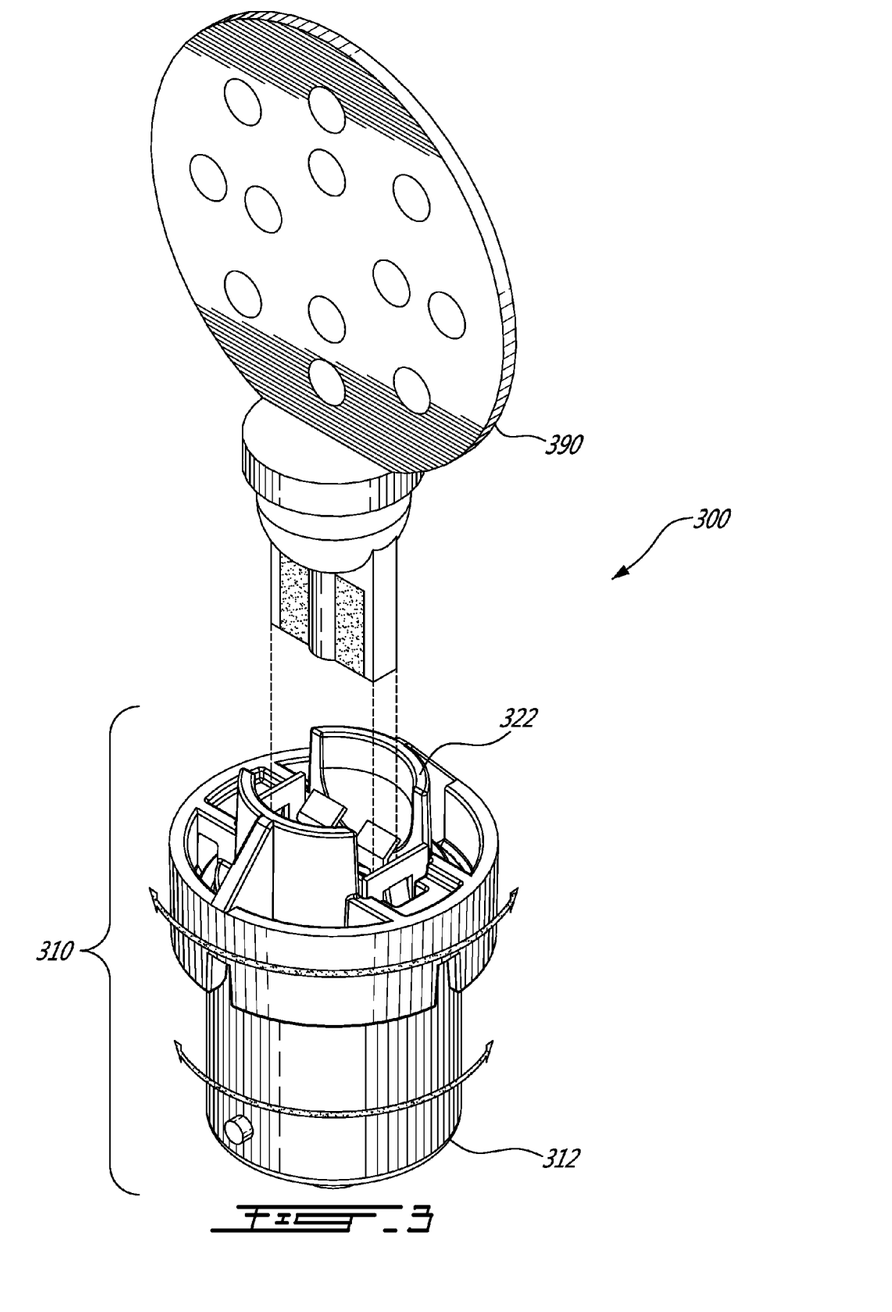
FIG. 3 is a perspective view of an exemplary kit of parts comprising a swivel adaptor and a wedge LED-array in accordance with the teachings of the present invention.

FIG. 3 shows a kit 300 of parts that can be sold to address the need for a unique product compatible with the different exemplified form factors of the light bulb casing 100. It contains a swivel adaptor 310 and a wedge LED-array 390. The swivel adaptor has a top portion opened to receive the wedge LED-array 390 and a bottom portion 312 compatible with a bayonet light bulb socket. The wedge LED-array 390 is adapted to fit into a wedge socket as the socket 130 exemplified in FIG. 1. Skilled persons will readily understand that the swivel adaptor 310 may be produced or manufactured by itself and could also be sold separately from the wedge LED-array 390. For instance, if other products compatible with the swivel adaptor 310 become available in the market, it may be useful to offer the swivel adaptor on its own rather than only in the kit 300.

The swivel adaptor 310 can be inserted in a bayonet light bulb socket such as the sockets 110A-C exemplified in FIG. 1. In order to receive the wedge LED-array 390 in all the exemplified sockets 110A-C, the top portion 322 needs to be rotatable from the bottom portion 312.

Figure 4:
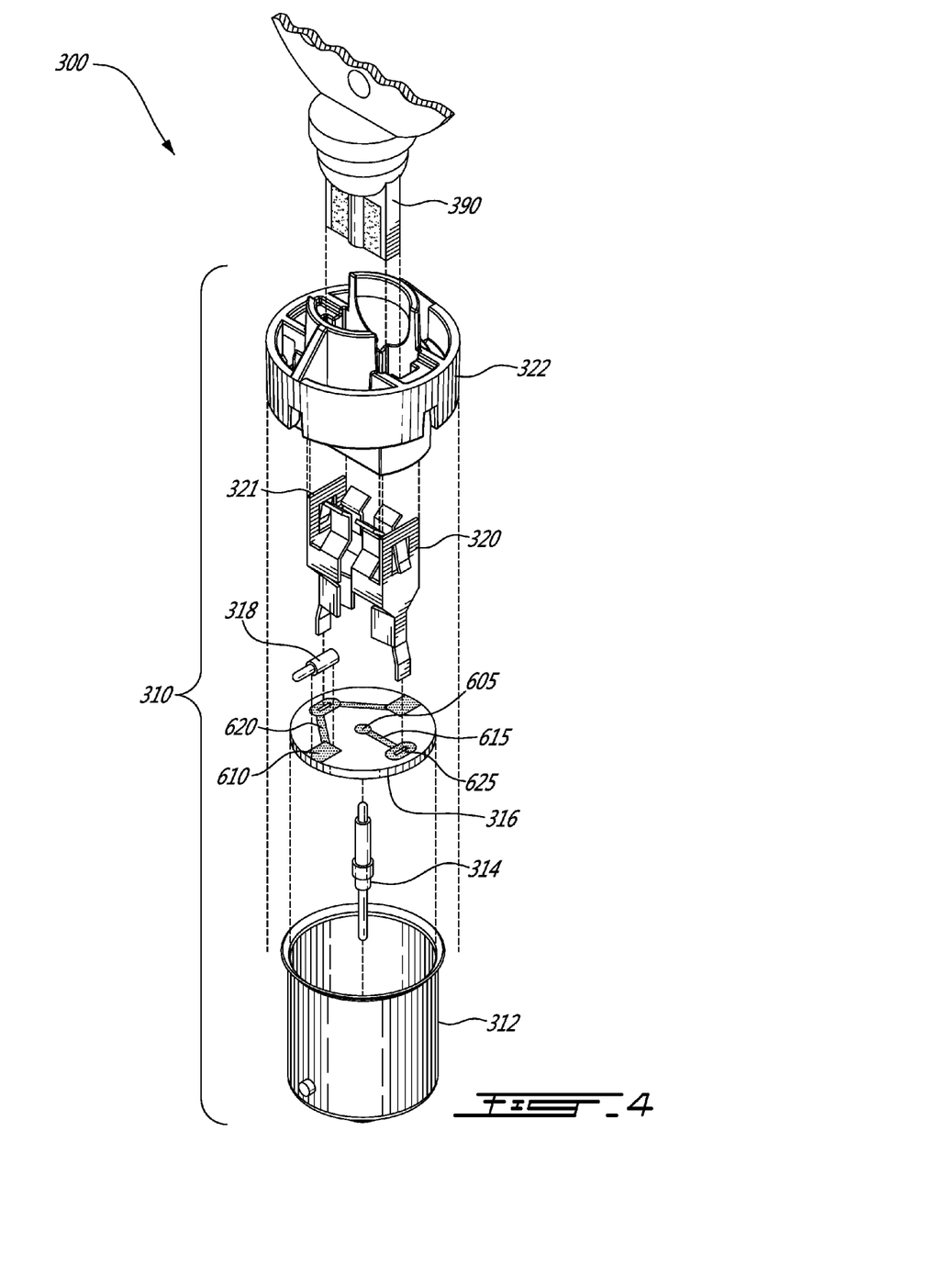
FIG. 4 is an exploded perspective view of an exemplary swivel adaptor in accordance with the teachings of the present invention.
Figure 5A:
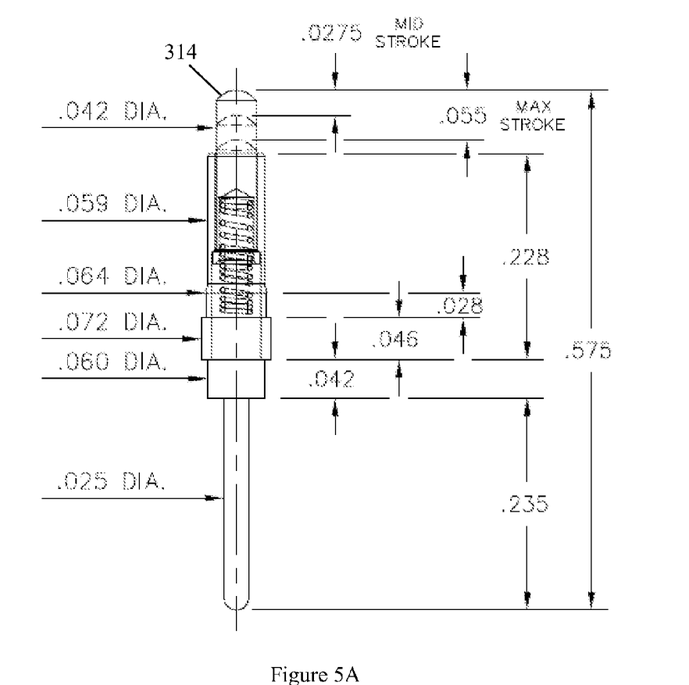
FIG. 5A and FIG. 5B herein referred to concurrently as FIG. 5 are perspective views of exemplary spring loaded connectors in accordance with the teachings of the present invention.

FIG. 4 shows an exploded perspective view of the swivel adaptor 310. The bottom portion 312 exemplified on FIG. 4 is a standard BA15S lamp cap. A bottom pressure pin 314 is inserted in the bottom portion and soldered in the lamp cap whereby connectivity of the bottom pressure pin 314 is made with the central external connector of the lamp cap. The bottom pressure pin 314 exemplified on FIG. 4 is a spring loaded connector shown in greater detail on FIG. 5A. The bottom pressure pin 314 of FIG. 5A is 0.575" long when fully extended and is capable of being compressed up to 0.055". The bottom pressure pin 314 of FIG. 5A has been originally designed for equipment used in test equipment or board to board interconnections or electronic programming equipment or others similar applications. The bottom pressure pin 314 of FIG. 5A is one example of a pressure pin that presents required conductivity characteristics. The bottom pressure pin 314 allows, as will be apparent hereinbelow, increased tolerancing in the assembly of the swivel adaptor 310.

Figure 5B:
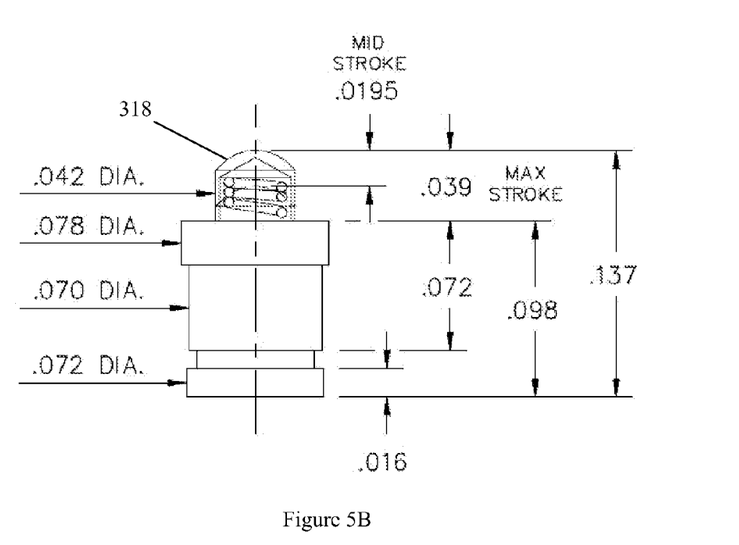
Figure 6:
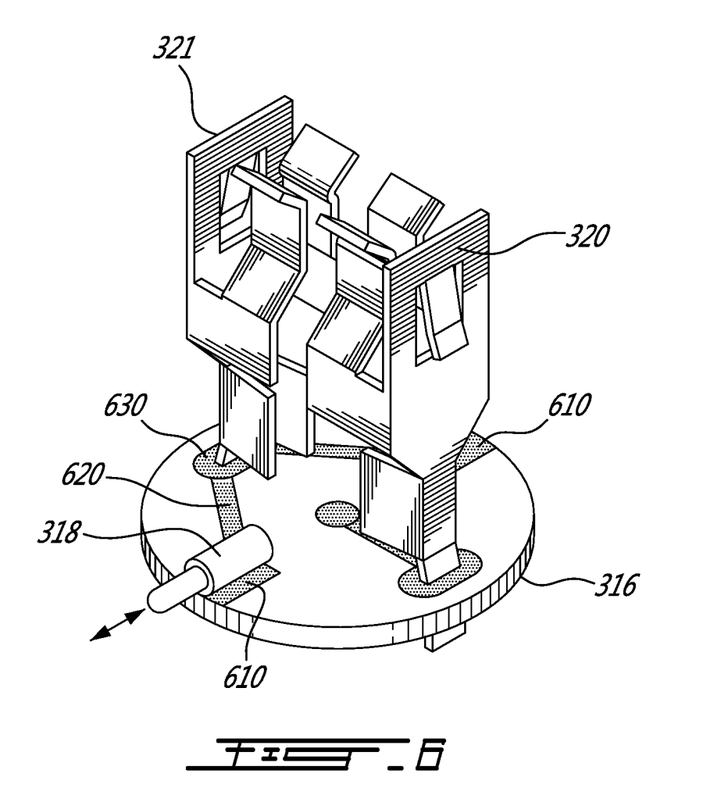
FIG. 6 is a perspective view of an exemplary assembled inner printed circuit board in accordance with the teachings of the present invention.

An inner printed circuit board (PCB) 316 is provided to fit within the bottom portion 312. FIG. 6, hereinafter concurrently referred to with FIG. 4, shows the assembled inner PCB 316. The PCB 316 presents a central contact point 605 that is meant to be in contact with the bottom pressure pin 314 once the PCB 316 is inserted in its position within the bottom portion 312. The PCB 316 also presents at least one radial contact point 610. The radial contact point 610 is adapted to receive a radial pressure pin 318 that extends beyond the diameter of the PCB 316. For instance, the radial pressure pin 318 may be soldered to the PCB 316. The radial pressure pin 318 exemplified on FIG. 4 is a spring loaded connector shown in greater detail on FIG. 5B. The radial pressure pin 318 is 0.137" long when fully extended and is capable of being compressed up to 0.039". Once the PCB 316 is inserted in its position within the bottom portion 312, the radial pressure pin 318 is in contact with the inner surface of the bottom portion 312 whereby connectivity is ensured between the external surface of the bottom portion 312 and the radial contact point. The radial pressure pin 318 of FIG. 5B has been originally designed for equipment in test equipment or board to board interconnections or electronic programming equipment or others similar applications. The radial pressure pin 318 of FIG. 5B is one example of a pressure pin that presents required conductivity characteristics. The radial pressure pin 318 allows, as will be apparent hereinbelow, increased tolerancing in the assembly of the swivel adaptor 310.

The PCB 316 presents a first connection route 615 from the central contact point 605 to a first soldering point 625 adapted to receive a first connector 320 and also presents a second connection route 620 from the radial contact point 610 to a second soldering point 630 adapted to receive a second connector 321. The connectors 320 and 321 are adapted to fixably fit within the top portion 322 in order to maintain the PCB 316 and the top portion 322 together. The position of the connectors 320 and 321 within the top portion 322 allows the wedge LED-array 390 to be connected to the PCB 316.

The top portion 322 exemplified on FIG. 4 is a molded plastic part that is adapted to snap onto the bottom portion 312 and allows the wedge LED-array 390 to be inserted therein. The plastic part is dimensioned so that, once assembled, detaching the bottom portion 312 from the top portion 322 is made difficult, but the bottom portion 312 and top portion 322 are rotatable over one another. The radial pressure pin 318 and the bottom pressure pin 314 ensure continuous electrical connectivity of the PCB 316 and the electric contacts of the bottom portion 312, even during rotation of the top portion 312 relative to the bottom portion 322. The pressure pins 314 and 318 are meant to adapt to the variations in the assembly of the top portion 322 (e.g., its positioning over the bottom portion 312) and for the expected tolerancing of the dimensions of the bottom portion's 312 inner surface.

As can be appreciated, the swivel adaptor provides electrical connectivity between its external first contact and the first connector via the bottom pressure pin and the PCB. The swivel adaptor also provides electrical connectivity between its outer surface and the second connector via the radial pressure pin and the PCB.

It should be noted that no internal wires interfere with the rotation and that the described solution provides for complete rotations, which is of particular relevance if the wedge LED-array 390 is polarized. However, it should be recognized that various means could be used to limit the rotation without affecting the teachings of the present invention.

It will be readily understood by skilled persons that the invention is not limited to the use of a bayonet lamp cap BA15S as exemplified. Other bayonet lamp caps (not shown) of various dimensions (e.g., BA15 (BA15S, BA15D, BAY15D, BAU15S, BAZ15D), BA9S, BA20S, BA20D, BA7S, etc.) could be used in accordance with the teachings of the present invention by adapting the dimensions of the other components (e.g., the pressure pins 314 and 318 and the top portion 312). Other types of lamp caps (e.g., E5, E10, E11, E12, E14, E17, E26/27, E39/40; MR11, MR16; G4, GU5.3, GY6.35, G9; T10, T20, T25 etc.) of various dimensions could also be used to match different socket types that present a similar limitation in terms of alignment of the lamp cap once positioned within the lamp socket. Skilled readers will recognize that, in a lamp cap that would present an irregular inner surface, the radial pressure pin may need to be dimensioned differently and/or means to limit rotation may be required.

Skilled persons will also recognize that other length-adjusting components could be used instead of the exemplified pressure pins 314 and 318. While there exist advantages in reusing existing pressure pins as shown in FIG. 5, specific pins (not shown) could also be designed for the same purpose of increasing tolerancing in the assembly of the swivel adaptor 310.

The illustrated solution uses the wedge LED-array 390, but skilled persons will recognise that conventional (e.g., wedge (T10, T20, T25), G4, GU5.3, GY6.35, G9, etc.) bulbs (not shown), while they may not take advantage of the solution, still remain compatible with the present invention. It will also be recognized that other directional LED-arrays (not shown) using other connection type than a wedge connector could also be used (e.g., G4, GU5.3, GY6.35, G9, etc.). Likewise, the wedge LED-array 390 does not need to be flat as shown, but could present other configurations that are advantaged by proper directional alignment. The light bulb casing 100 has been used to illustrate the context of use of the present invention. Skilled person will recognise that the present invention is capable of being used and adapted as necessary to different contexts benefiting from directional alignment of connectors (e.g., for lighting applications in recreational vehicles, emergency lamps, reading lamps, car and trailer taillight, projector lamps, etc.) without departing from the teachings of the present invention.

Figure 7:
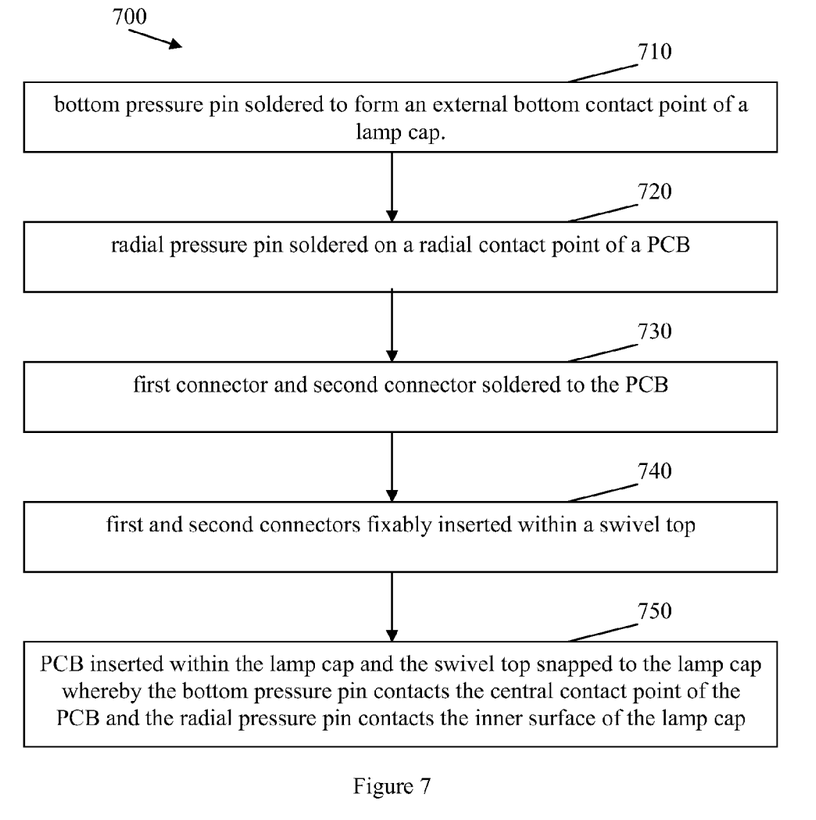
FIG. 7 is a flow chart of an exemplary method of assembling a swivel adaptor in accordance with the teachings of the present invention.

FIG. 7 shows an exemplary assembling method 700 for the swivel adaptor 310. A bottom pressure pin is soldered 710 to form an external bottom contact point of a lamp cap. The bottom pressure pin is positioned within the lamp cap. A radial pressure pin is soldered 720 on a radial contact point of a printed circuit board (PCB). The PCB has a central contact point. A first connector and a second connector are soldered 730 to the PCB. The first connector is in electrical connection to the central contact point and the second connector is in electrical connection to the radial contact point. The first and second connectors are fixably inserted 740 within a swivel top thereby allowing the connectors to be functionally exposed through the swivel top. The PCB is inserted 750 within the lamp cap whereby the bottom pressure pin contacts the central contact point of the PCB and the radial pressure pin contacts the inner surface of the lamp cap. The swivel top rotatably snaps on the lamp cap. It should be appreciated that the steps of the exemplary assembling method may not be performed in the same order as exemplified on FIG. 7.

The description of the present invention has been presented for purposes of illustration but is not intended to be exhaustive or limited to the disclosed embodiments. Many modifications and variations will be apparent to those of ordinary skill in the art. The embodiments were chosen to explain the principles of the present invention and its practical applications and to enable others of ordinary skill in the art to understand the invention in order to implement various embodiments with various modifications as might be suited to other contemplated uses. Drawings are not necessarily drawn to scale.

The invention claimed is:

1. A device comprising:
    (a) a bottom portion providing at least a first external electrical contact point below the bottom portion and a second external electrical contact point provided by an outer surface of the bottom portion, an inner surface of the bottom portion being electrically conductive with the outer surface;
    (b) a bottom pressure pin, within the bottom portion, electrically connected to the first contact point;
    (c) a top portion rotatably fixed to the bottom portion, the top portion comprising a first electrical connector and a second electrical connector, wherein the first and second connectors are functionally exposed through the top portion;
    (d) a printed circuit board (PCB), within the bottom portion, providing a first connection route in electrical connection with the first electrical connector and a second connection route in electrical connection with the second electrical connector, wherein the PCB is fixably attached to the first and second electrical connectors and wherein the first connection route is in continuous electrical contact with the bottom pressure pin; and
    (e) a radial pressure pin fixably connected to the PCB's second connection route, the radial pressure pin providing continuous electrical connection with the second contact point through the bottom portion's inner surface.

2. The device of claim 1, wherein the continuous electrical connection between the PCB's first connection route and the bottom pressure pin, and the continuous electrical connection between the bottom portion's inner surface and the radial pressure pin, are maintained while the top portion is rotated over the bottom portion.

3. The device of claim 2, wherein the radial pressure pin is a spring loaded connector that can vary in length to maintain the continuous electrical connection with the inner surface.

4. The device of claim 2, wherein the bottom pressure pin is a spring loaded connector that can vary in length to maintain the continuous electrical connection with the PCB's first connection route.

5. The device of claim 3, wherein the spring loaded connector is designed for electronic programming equipment, test equipment or board-to-board interconnections.

6. The device of claim 4, wherein the spring loaded connector is designed for electronic programming equipment, test equipment or board-to-board interconnections.

7. The device of claim 4, wherein the bottom pressure pin contacts with the PCB's first connection route at a central connection point of the PCB.

8. The device of claim 1, wherein the first and second connectors are compatible with a wedge connector and a G4 connector through the top portion.

9. The device of claim 1, wherein the bottom portion's outer surface is shaped as a bayonet lamp cap or a screw lamp cap.

10. A kit of parts for providing a replacement light bulb comprising:
   (a) a swivel adaptor comprising:
      (i) a bottom portion providing at least a first external electrical contact point below the bottom portion and a second external electrical contact point provided by an outer surface of the bottom portion, an inner surface of the bottom portion being electrically conductive with the outer surface;
      (ii) a bottom pressure pin, within the bottom portion, electrically connected to the first contact point;
      (iii) a top portion rotatably fixed to the bottom portion, the top portion comprising a first and a second electrical connectors functionally exposed therethrough;
      (iv) a printed circuit board (PCB), within the bottom portion, providing a first connection route in electrical connection with the first electrical connector and a second connection route in electrical connection with the second electrical connector, wherein the PCB is fixably attached to the first and second electrical connectors and wherein the first connection route is in continuous electrical contact with the bottom pressure pin; and
      (v) a radial pressure pin fixably connected to the PCB's second connection route, the radial pressure pin providing continuous electrical connection with the second contact point through the bottom portion's inner surface; and
   (b) a Light Emitting Diode (LED)-array PCB compatible with the first and second connectors.

11. The kit of claim 10, wherein the LED-array PCB provides a wedge or G4 connector.

12. The kit of claim 10, wherein the LED-array PCB is flat.

13. A method for assembling a swivel adaptor comprising:
   (a) soldering a bottom pressure pin to form an external bottom contact point of a lamp cap, wherein the bottom pressure pin is positioned within the lamp cap;
   (b) soldering a radial pressure pin on a radial contact point of a printed circuit board (PCB), wherein the PCB has a central contact point;
   (c) soldering a first connector to the PCB in electrical connection to the central contact point;
   (d) soldering a second connector to the PCB in electrical connection to the radial contact point;
   (e) fixably inserting the first and second connectors within a swivel top thereby allowing the connectors to be functionally exposed through the swivel top;
   (f) inserting the PCB within the lamp cap whereby the bottom pressure pin contacts the central contact point of the PCB and the radial pressure pin contacts the inner surface of the lamp cap, wherein the swivel top rotatably snaps on the lamp cap.

14. The method of claim 13, wherein the radial pressure pin is a spring loaded connector that can vary in length to maintain a continuous electrical connection with the inner surface during rotation of the swivel top over the lamp cap.

15. The method of claim 13, wherein the bottom pressure pin is a spring loaded connector that can vary in length to maintain a continuous electrical connection with the PCB's central contact point during rotation of the swivel top over the lamp cap.

* * * * *